United States Patent [19]

Cassat

[11] Patent Number: 4,756,756
[45] Date of Patent: Jul. 12, 1988

[54] FORMING OF THICK-LAYER, HYBRID ELECTRONIC PRINTED CIRCUITS

[75] Inventor: Robert Cassat, Ternay, France

[73] Assignee: Rhone-Poulenc Specialites Chimiques, Courbevoie, France

[21] Appl. No.: 705,726

[22] Filed: Feb. 26, 1985

Related U.S. Application Data

[62] Division of Ser. No. 441,153, Nov. 12, 1982, Pat. No. 4,517,227.

[30] Foreign Application Priority Data

Nov. 17, 1981 [FR] France .................. 81 21642

[51] Int. Cl.$^4$ .................................. C09D 11/10
[52] U.S. Cl. ........................ 106/20; 106/1.23; 106/1.26; 106/480; 252/518; 427/96; 427/101; 427/126.3; 524/413; 524/435; 524/555
[58] Field of Search ............. 106/20, 308 M, 1.11, 106/1.30, 1.23, 1.12, 1.26; 523/160; 427/96, 98, 101, 102, 103, 126.3; 252/518; 524/413, 435, 555; 260/DIG. 38

[56] References Cited

U.S. PATENT DOCUMENTS 3,226,256 12/1965 Schneble, Jr. et al. .......... 427/98
3,451,813 6/1969 Kinney et al. .................. 430/319
3,776,769 12/1973 Buck et al. ..................... 106/1.12

OTHER PUBLICATIONS

Derwent Abstract, Accession No. 81-06663D/05, Japanese Pat. No. J55151073, May 15, 1979.

Primary Examiner—Amelia B. Yarbrough
Attorney, Agent, or Firm—Burns, Doane, Swecker & Mathis

[57] ABSTRACT

Thick-layer hybrid electronic printed circuits are formed by printing predetermined circuit pattern onto an insulating substrate by deposition of predetermined ink pattern thereupon, advantageously by silk-screening or masking, and thence baking said ink circuit pattern, and repeating the deposition/baking steps as required, the subject forming process featuring use of an insulating ink comprising a non-conductive metallic oxide extender, desirably cuprous oxide, which ink is thus either potentially conductive or potentially resistive, and the development of such conductivity or resistivity, after baking, by treating the ink pattern with a reducing agent, desirably a borohydride, as to readily and quantitatively convert said metal oxide into a conducting metal.

8 Claims, 2 Drawing Sheets

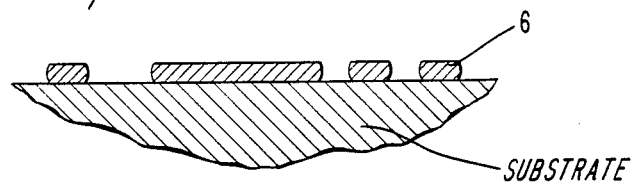
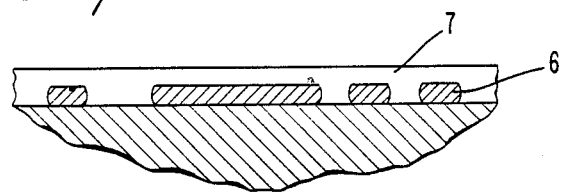
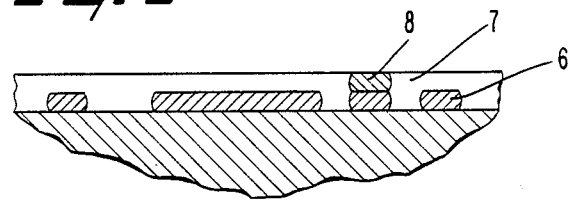
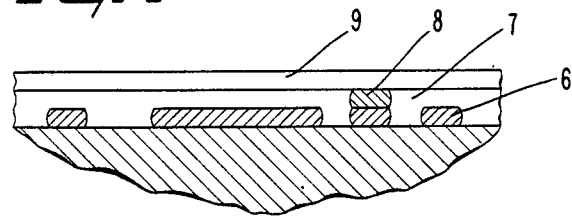
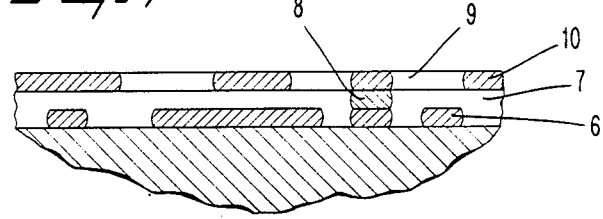

FORMING OF THICK-LAYER, HYBRID ELECTRONIC PRINTED CIRCUITS

This application is a division of application Ser. No. 441,153, filed Nov. 12, 1982, now U.S. Pat. No. 4,517,227.

BACKGROUND OF THE INVENTION

1. Field of the Invention:

The present invention relates to the forming of electronic printed circuits of the thick-layer hybrid type, to certain means adapted for carrying out the forming process and to the printed circuits formed thereby.

2. Description of the Prior Art:

Hybrid microelectronics has evolved in the art in response to two concerns: to solve the problems of bulk and to improve the reliability of the circuits. As distinct from a monolithic circuit, which is obtained from a semiconducting substrate in which all of the components (active and passive) are simultaneously produced in the course of but a single process, a hybrid circuit is produced on an insulating substrate and contains only passive elements; if there are any active elements, namely, semiconductors or integrated circuits, same are later added by soldering. Hybrid circuits are classified as thin-layer circuits and thick-layer circuits. This classification relates to the thickness of the deposited layers: from 0.02 to 10 $\mu$m in the case of thin layers, and from 10 to 50 $\mu$m in the case of thick layers.

For the thin layers, the layers are typically deposited by utilizing the techniques of vacuum evaporation or cathodic sputtering. For the thick-layer hybrids, the technology used generally consists of printing the desired circuits directly onto the insulating substrate by means of conventional silk-screen processes.

Silk-screen printing consists of forcing the ink which it is desired to deposit onto the substrate through the fine meshes of a screen, some of which are blocked by a special lacquer, the free meshes being a very precise representation of the half-tone drawing of the circuit to be reproduced.

Any hybrid circuit must be produced on a substrate. The final quality of the circuit will depend upon the selection of a good substrate. The substrate generally serves a triple purpose: that of mechanical support, not only for the deposited circuit but also for the active components which it is to receive; that of electrical insulator, its resistivity, therefore, having to be as high as possible and its loss factor as low as possible; and that of heat dissipator, which therefore requires an excellent thermal conductivity and a high specific heat. Among the suitable subtrates, representative are: inorganic materials, such as, for example, ceramics like beryllium oxide, alumina and Pyrex glass; and organic materials, such as, for example, reinforced resins made from thermosetting polymeric substances.

Once it has received a conducting, insulating or resistant print in the form of an ink having a well-defined rheology, the substrate is baked or cured in an oven such that the deposit becomes perfectly integral with the substrate. Finally, the output wires are attached and, after connection of the active components, if appropriate, the finished module can be coated by encapsulation in a glass or a polymeric resin in order to protect it from the action of moisture and to make it easier to handle.

Virtually all thick-layer circuits each receive several successive prints. In a typical process, the conducting layer is first printed and baked; the resistors, which will be adjusted to the required values, are then printed and baked. This process can also include the printing of an insulating layer. It is thus possible to successively deposit, for example, conducting insulating, conducting and resistant layers. Briefly, all of the stages of such process can be summarized in the following scheme:

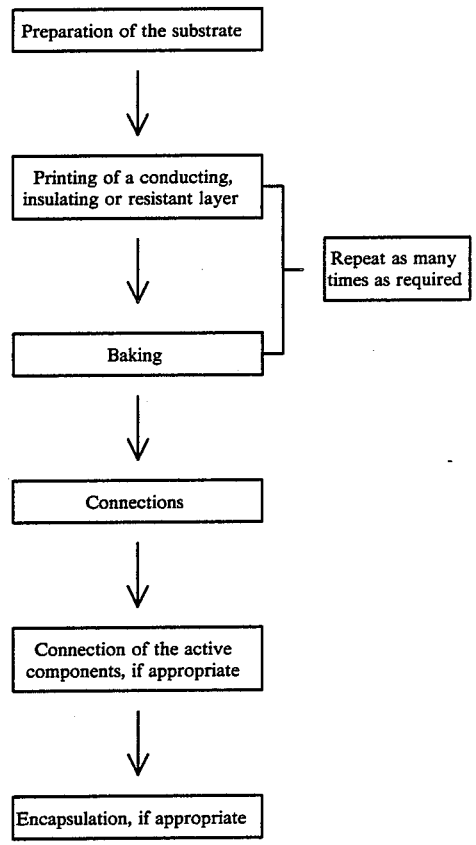

As regards the silk-screen printing inks required for the manufacture of the thick-layer circuits immediately above-described, these are therefore of three types: conducting, resistant and insulating inks. The conducting and resistant inks typically consist of the combination of a metal extender with a binder and, if appropriate, a diluent making it possible to adjust the rheological properties of the inks. By modifying the chemical structure of the binder, the baking fixes the metal deposit to the substrate and makes it possible to obtain the desired final conducting or resistant circuit. The insulating inks differ from the aforesaid inks essentially by the fact that they do not contain conducting metal extenders.

In hybrid circuits, the ink binder commonly consists of inorganic particles, such as, for example, fusible special glasses in powder form. As these glass-containing inks are baked at about 700° C. to 1,100° C., their use means that ceramics are preferably selected as the insulating substrates, and powders of non-oxidizable noble metals, in particular platinum, gold, silver or palladium/gold, palladium/silver or platinum/gold alloys, or powders of conducting oxides derived from noble metals, are selected as the conducting metal extenders. Because of the use of noble metals, the adoption of this technique results in high expenditure, which will constitute an obstacle to its development. It too has been proposed to use powders of the non-noble metals, such as, for example, copper, but in that case the final baking should be carried out in a non-oxidizing atmosphere, and this measure complicates the technology of the ovens which can be used.

It is possible to replace the aforesaid inorganic binder by an organic binder, such as, for example, an epoxy resin. The ink-baking temperatures required in this case are considerably lower than in the case of the inorganic binders; same typically range from 100° C. to 300° C. It is then possible to use types of insulating substrates other than ceramics, such as, for example, reinforced organic resins, and to use inks based upon a non-noble metal extender, there being greatly reduced risks of oxidation of the metal extender during baking carried out, in the conventional manner, in the atmosphere at from 100° C. to 300° C. However, the inks prepared and baked in this manner entail a unique and significant disadvantage: they are difficult to solder. Apart from their function of conducting an electric current, the inks must in fact be contact points for receiving wires or, if appropriate, lugs of active components, which assumes an excellent suitability for soldering, in particular with tin-based alloys.

In the metallization of insulating substrates, to produce high-quality conducting printed circuits capable of withstanding soldering without difficulty, it has been proposed to use inks comprising an organic binder made of a polymeric substance and a metal extender based on cuprous oxide (compare U.S. Pat. Nos. 3,226,256 and 3,347,724). After baking, the deposit obtained is reduced by treatment with an acid, in order to convert the cuprous oxide to copper metal; this layer of copper is then reinforced by deposition of a ductile metal, which can also be copper, employing a chemical oxidation/reduction reaction. It is known that the reduction of cuprous oxide with an acid involves the formation of an unstable cuprous salt which disproportionates to give, on the one hand, cupric salts, and, on the other hand, copper metal, which deposits, according to the equation:

$$Cu_2O + 2H^+ \rightarrow Cu^{++} + Cu + H_2O$$

In a reduction of this type, the yield of copper metal is well below 50%: in fact only half of the initial copper is capable of being converted to conducting metal and, furthermore, a portion of this reduced copper is dissolved by the acid agent used. As a result, the metal deposit obtained will only be very slightly conducting. It is for this reason that, in this technique, recharging of the deposited circuit with metal is always carried out after the reduction step. The fact that such recharging is carried out by a chemical oxidation/reduction method and not by an electrolytic method (which does not work) is confirmation of the poorly conducting nature of the original deposit. A first disadvantage of this method is the fact that the recharging with metal is a lengthy operation, the deposition rate in fact being on the order of 1 μm per hour. A second disadvantage is the fact that there will be an increase in the thickness of the original deposit, which may reach 100%, and this increase in the thickness is likely to limit the number of layers deposited by silk-screen printing, in order to avoid an excessively great loss of inherent flatness of the substrate as a result of the successive depositions.

Thus, it has proved necessary to develop, in the manufacture of hybrid circuits, a technique by means of which conducting circuits could be economically deposited and in a technically simple manner, without electrochemical recharging, the said conducting circuits being suitable for soldering and not containing extra thicknesses.

Furthermore, as has been explained above, the thick-layer hybrid circuits each receive several successive silk-screen prints. For example, a condenser will be formed by the deposition and baking of the lower electrode 1, the printing and baking of the dielectric 2 and the printing of the upper electrode 3, followed by baking of the assembly (compare FIG. 1 of the drawings, which represents a condenser in section). The manufacturing process therefore involves three successive depositions with two different inks: a conducting ink and an insulating ink. For other types of hybrid circuits, the manufacturing process may also involve additional depositions with a resistant ink. Here again, it proved necessary to develop a technique making it possible to simplify the procedure for printing the layers, in particular by limiting the number of inks required.

SUMMARY OF THE INVENTION

Accordingly, a major object of the present invention is the provision of an improved process for the forming of thick-layer hybrid circuits which otherwise avoids those disadvantages and drawbacks above-outlines, while at the same time satisfying the aforesaid stated objectives.

BRIEF DESCRIPTION OF THE DRAWINGS

FIGS. 3 to 7 are cross-sectional views illustrating the forming of a hybrid circuit according to the invention, the several Figures depicting said circuit in various successive intermediate and final stages.

DETAILED DESCRIPTION OF THE INVENTION

Figure 1:
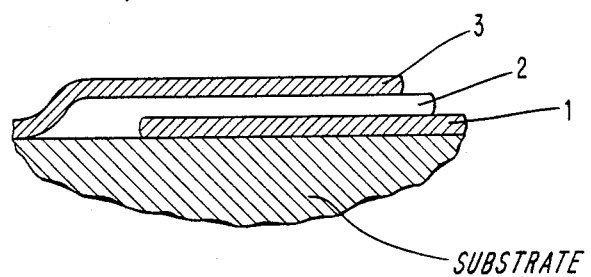
FIG. 1 is a cross-sectional view of typical condenser, including upper and lower electrodes and a dielectric interlayer.

More particularly according to this invention, featured is a process for the manufacture of thick-layer hybrid circuits which comprises printing the desired circuits on an insulating substrate by the deposition of a suitable ink, in predetermined pattern, and then baking it, these deposition and baking operations being repeated as many times as required, said process being characterized in that an insulating ink is used which comprises a non-conducting oxide derived from a non-noble metal, and which has the characteristics of being potentially conducting or potentially resistant, according to its composition, and in that the conducting or resistant nature of the ink is developed, after it has been deposited and baked, by subjecting it to the action of a reducing agent which is specially selected, on the one hand, for its ability to convert the metal oxide rapidly and quantitatively to conducting metal, and, on the other hand, for its ability to easily modify the magnitude of the reduction in the thickness of the deposit produced.

Even more particularly, the present invention relates to a process for the manufacture of hybrid circuits in which the metal extender of the ink preferably comprises cuprous oxide, and in which the reducing agent preferably comprises a borohydride.

The present invention also relates to the potentially conducting and resistant inks utilized in carrying out the subject process.

The present invention also relates to the hybrid circuits obtained by carrying out the present process.

By the term "potentially conducting ink", there is intended an ink which, after baking and reduction, will have a surface resistivity of at most 0.1 Ω/□. By the term "potentially resistant ink", there is intended an ink which, after baking and reduction, will have a surface resistivity varying from 10 to a value of $10^3$ Ω/□ or more. The resistivity sought to be obtained will depend, on one hand, on the composition of the ink, and, on the other hand, on the magnitude of the reduction in the thickness of the deposit produced.

In general, the inks intended for carrying out the process according to the invention consist, before baking, of the combination of at least one extender based on cuprous oxide with a binder and a diluent enabling adjustment of the rheology of the ink. In the case of the potentially conducting ink, it is distinguished by the fact that it contains a single extender based on cuprous oxide, which represents 40 to 70% of the weight of the ink, and a binder which represents 4 to 10% of the weight of the ink. In the case of the potentially resistant ink, it is distinguished by the fact that it contains a mixture of extenders comprising 40 to 60% by weight of cuprous oxide and 60 to 40% by weight of an insulating extender which is totally inert under the reduction conditions, such as, for example, powdered glass, alkali metal silicates, alumina or natural carbonates and sulfates, this mixture of extenders representing 30 to 60% of the weight of the ink, and a binder which represents 10 to 30% of the weight of the ink.

Although inorganic binders can be used, organic binders are advantageously used for the inks according to the invention. Suitable types of organic binders which are especially representative are: resins of the phenolic type, such as, for example, condensates of phenol, resorcinol, cresol or xylenol with formaldehyde or furfural; resins of the unsaturated polyester type, prepared, for example, by reaction of an unsaturated dicarboxylic anhydride with a polyalkylene glycol; resins of the epoxy type, such as, for example, the reaction products of epichlorohydrin with bisphenol A; and resins of the polyimide type, such as, for example, those obtained by reaction of an unsaturated dicarboxylic acid N,N'-bis-imide with a primary polyamine and, if appropriate, a suitable adjuvant.

The resin used is generally in the form of a thermosetting prepolymer (having a softening point and still being soluble in certain solvents) at the time of preparation of the ink, and it is in the completely cross-linked form (infusible and totally insoluble) in the ink such as obtained after baking. The resin in the form of a prepolymer, used initially, can advantageously contain a hardening catalyst.

Preferably, the binder consists of a resin of the polyimide type, obtained by reaction of an unsaturated dicarboxylic acid N,N'-bis-imide with a primary polyamine, according to, for example, French Pat. No. 1,555,564, U.S. Pat. Nos. 3,562,223 and 3,658,764 and U.S. Pat. No. Re. 29,316; hereby expressly incorporated by reference. The polyimide resin can also be obtained by reaction of the bis-imide with the polyamine and various adjuvants, such as, for example, mono-imides (according to French Pat. No. 2,046,498), monomers, other than imides, containing one or more polymerizable groups of the type $CH_2=C<$ (according to French Pat. No. 2,094,607), unsaturated polyesters (according to French Pat. No. 2,102,878) or hydroxylic organosilicon compounds (according to French Pat. No. 2,422,696); these also hereby being expressly incorporated by reference. In the case where such adjuvants are used, it will be appreciated that the polyimide resin in the form of a prepolymer can be: the reaction product of a bis-imide and a polyamine with an adjuvant, or the reaction product of a bis-imide prepolymer and a polyamine with an adjuvant, or alternatively a mixture of a bis-imide prepolymer and a polyamine with an adjuvant.

The polyimide resin in the form of a prepolymer, used initially, can advantageously contain small amounts of a free-radical polymerization initiator, such as, for example, dicumyl peroxide, lauroyl peroxide or azobisisobutyronitrile, or of an anionic polymerization catalyst, such as, for example, diazobicyclooctane.

In the present invention, it is even more preferred to use a polyimide resin resulting from the reaction of a bis-maleimide, such as N,N'-4,4'-diphenylmethane-bis-maleimide, with a primary diamine, such as 4,4'-diaminodiphenylmethane, and, if appropriate, one of the various adjuvants mentioned above.

As regards the diluents which can be used, they generally consist of organic liquids having a variety of viscosities, which can range, for example, from 1 cpo to several tens of poises, the chemical nature of the organic liquids not being critical, provided that they are not solvents for the binder used in the form of a thermosetting prepolymer, or solvents for the lacquer which blocks some of the meshes of a silk screen. Suitable types of diluents which are particularly representative are: ethers of alkanols and glycols, such as, for example, diglyme and butoxyethanol; and terpene alcohols, such as, for example, α-, β-, and γ-terpineols.

A diluent which is very particularly suitable, especially when the selected binder belongs to the preferred group of the resins of the polyimide type defined above, consists of α-, β- or γ-terpineol.

As regards the composition of the inks, it still remains to be specified that the cuprous oxide, the totally inert extender and the binder are used in the form of powders. The particle size of the extenders is generally from 0.1 to 5 μm and the particle size of the binder is generally from 5 to 40 μm.

It has been indicated above that the resistivity which it is desired to obtain for the deposit will depend on the magnitude of the reduction in the thickness of the deposit produced, as well as on the composition of the ink. Therefore, the nature of the reducing treatment carried out after baking will now be discussed in greater detail.

Thus, it has been found that the conversion of the cuprous oxide to copper metal can be carried out easily and quantitatively by reaction with borohydrides. The conversion is represented by the equation:

$$4Cu_2O + BH_4^- \rightarrow 8Cu + B(OH)_3 + OH^-$$

The ease with which this reaction takes place is probably due to the catalytic effect of the copper metal, which could be explained by the intermediate formation of unstable copper hydride.

The borohydrides which can be used in the present invention include substituted borohydrides, as well as unsubstituted borohydrides. It is possible to use substituted borohydrides in which at most three hydrogen atoms of the borohydride ion have been replaced by inert substituents, such as, for example, alkyl radicals, aryl radicals or alkoxy radicals. It is preferred to use alkali metal borohydrides in which the alkali metal moiety consists of sodium or potassium. Typical examples of suitable compounds are: sodium borohydride, potassium borohydride, sodium diethylborohydride, sodium trimethoxyborohydride and potassium triphenylborohydride.

The reducing treatment is carried out in a simple manner by contacting the ink, after baking, with a solution of borohydride in water, or in a mixture of water and an inert polar solvent, such as, for example, a lower aliphatic alcohol. Purely aqueous solutions of borohydride are preferred. As regards the concentration of these solutions, it can vary over wide limits and preferably ranges from 0.5 and 10% (by weight of borohydride in the solution). The reducing treatment can be carried out at elevated temperature, but it is preferred to carry it out at a temperature close to ambient temperature, for example, at from 15° C. to 30° C. As regards the course of the reaction, it should be noted that it gives rise to $B(OH)_3$ and to $OH^-$ ions, the effect of which is to cause an increase in the pH of the medium during the reduction. Now, at high pH values, for example, above 13, the reduction is slowed down and it can thus be advantageous to carry out the reaction in a buffered medium such as to provide a well-defined rate/extent of reduction.

It is mainly by varying the time of treatment that it is possible to effectively modify the magnitude of the reduction in the thickness of the deposit and consequently to modify the value of the resistivities which will develop. The time required for treatment is typically fairly short and usually ranges from one minute or less to about ten minutes. For a given treatment time, it is also possible to influence the rate of reduction by adding a variety of reduction accelerators to the medium, such as, for example, boric acid, oxalic acid, citric acid, tartaric acid or metal chlorides, such as the chlorides of cobalt(II), nickel(II), iron(II), manganese(II) or copper(II). At the beginning of the reduction, the reaction essentially involves the cuprous oxide particles which are located on the surface of the deposit and which are in direct contact with the reducing agent. Because of the catalytic effect of the copper metal, the reduction reaction will then continue within the bulk of the deposit, even though the ink does not have a particularly marked hydrophilic nature. Depending upon the time of treatment, the thickness of the ink which is in fact subjected to reduction can represent from 10 to 100% of the thickness of the deposit.

It will be appreciated that the resistivity values are also a function of the geometry of the conducting or resistant components selected. This aspect of the subject forming process thus requires discussion of the methods by which the desired circuits can be constructed on the insulating substrate.

A first method consists of depositing the inks by technique conventionally used in the manufacture of hybrid circuits, namely, the silk-screen technique. However, according to the present invention, the production of a conducting or resistant circuit entails effecting a reducing treatment upon the deposit after baking the ink and before making the next print. It must be understood that, in the case of the printing of an insulating circuit, the ink used, which can be either potentially conducting or potentially resistant, will not, on the other hand, undergo any reducing treatment after baking.

The ability of the extender based on cuprous oxide to impart, to the same ink, firstly an excellent insulating nature at the beginning of the operation and secondly an excellent conducting or resistant nature after reduction, permits a striking modification of the conventional method heretofore employed in the art, as above-described. It is now possible for the selective deposit obtained by silk-screening printing to be replaced by a uniform deposit of a potentially conducting or resistant ink, for example by immersion, spraying, calendering, knife coating or transfer, followed, after baking of the ink and in the case where conducting or resistant circuits are to be produced, by selective developing of the conducting or resistant parts by reduction using a masking technique; it is this replacement which constitutes the subject of a second, particularly advantageous embodiment. This masking technique is normally used in the field of printed circuits and, to our knowledge, has not as yet been applied in the field of thick-layer hybrid circuits. It will be recalled that this technique consists of covering the uniformly deposited and baked layer of ink with a photosensitive resin, also called a photoresist, and in subsequently exposing this photosensitive resin, through a mask, to radiation rich in ultraviolet rays. The photosensitive resins are organic polymers which undergo chemical conversion under the influence of ultraviolet rays, modifying their solubility in certain solvents. The purpose of the mask is to permit the radiation to selectively pass therethrough, in the pattern of the circuit to be printed. It frequently comprises a fine layer of chromium deposited onto a glass plate or is comprised of a photographic gelatin film. If a positive photoresist is used, the non-opaque portions of the mask correspond to the desired circuit; conversely, in the case of a negative photoresist, it is the opaque areas which correspond to the desired circuit. Developing is then carried out; this consists of dissolving the appropriate portions of the photosensitive resin, namely, according to the nature of the photoresist: either the portions rendered soluble by exposure, in the case of a positive photoresist, or the unexposed parts not hardened by exposure, in the case of a negative photoresist. The potentially conducting or resistant ink therefore appears at the locations corresponding to the dissolved portions. The remaining operations comprise reductive attack of the ink exposed in this manner, followed by removal of the layer of photosensitive resin which remains and which has consequently become superfluous; as the ink which has been protected by the photoresist is not subjected to any reductive attack, it remains insulating.

The utilization of this second method is therefore very advantageous, since it is now possible, beginning with a single potentially conducting ink, to select conducting zones and insulating zones on one and the same layer of deposit. In the same fashion, beginning with a potentially resistant ink, it is also possible to select resistant zones and insulating zones on one and the same layer of deposit; moreover, for a given ink, the resistant zones do not have a single resistivity value but variable resistivity values, which can easily be adjusted by virtue of the action of the reducing treatment.

Figure 2:
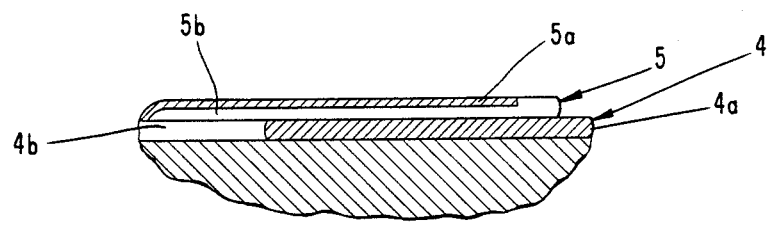
FIG. 2 is a cross-sectional view of a condenser manufactured according to this invention.

Again considering the case of a condenser, it can now be manufactured in the following simplified manner: firstly, a first layer 4 of a potentially conducting ink is deposited in a non-selective manner; then, after baking, the reducing treatment is applied in the presence of the mask, which makes it possible to selectively develop the lower electrode 4a and a dielectric zone 4b; then, a second layer 5 of the same ink is deposited in a non-selective manner, and the selective reduction of this ink makes it possible to form the upper electrode 5a and another dielectric zone 5b (compare FIG. 2 of the Figures of Drawing, which illustrates this condenser in cross-section). Compared with the prior state of the art of using silk-screen printing, not only is the required number of deposits reduced from three to two, but also the required number of inks is reduced from two (conducting and insulating inks) to one (potentially conducting ink). In the same manner, the technique provided by the present invention makes it possible for all three of the inks heretofore employed in the field of hybrid circuits (conducting, resistant and insulating inks) to be replaced by only two inks, the one being potentially conducting and the other potentially resistant.

A third embodiment of forming the desired circuits which can advantageously be carried out consists of using both the silk-screen technique and the masking technique. In this embodiment, it is possible to use the silk-screen technique to produce the first level (or levels) of circuits and then to use the masking technique to produce the next level (or levels) of circuits. It is also possible to carry out the sequence comprising one or more depositions by the silk-screen technique, then one or more depositions by the masking technique and then one or more depositions by the silk-screen technique. The procedure which consists of producing uniform deposits by the masking technique after deposits by the silk-screen technique permits a levelling of the entirety of the substrate, thus making it possible to undertake the production of subsequent deposits under good conditions of inherent flatness. The conventional silk-screen technique in fact gives rise, after deposition of the ink, to relief zones which correspond to the paths of the desired circuit, and to recessed zones which correspond to the uncovered portions of the substrate, and it will be readily be understood that, when successive deposits are produced, this lack of inherent flatness of the substrate will increase substantially. Because of a uniform initial deposit, the masking technique, on the other hand, will result in perfectly planar layers, even after reduction, therefore making it possible, when it is carried out after deposits have been applied by the silk-screen technique, to easily correct or adjust the lack of inherent flatness generated by silk-screen printing.

The methods of deposition immediately above-described result in potentially conducting or resistant layers having a thickness, after baking, which typically ranges from 10 to 50 $\mu$m and more usually ranges from 15 to 35 $\mu$m.

Generally, once deposited, the inks are dried before being subjected to baking. This drying, at temperatures on the order of 50° C. to 100° C., can be carried out, in particular, in an oven, on a heating plate or by infra-red radiation. The drying time is on the order of one minute to about ten minutes. After drying, the inks are baked at a higher temperature in order to complete the removal of the diluent and to bind the deposit to the substrate and cause them to acquire their definitive characteristics. The baking temperatures generally range from 100° C. to 300° C. In the event that the ink binder belongs to the preferred group of resins of the polyimide type, the baking temperature preferably ranges from 140° C. to 200° C. The baking is generally carried out in ambient air, in a static oven or a tunnel oven.

As regards the remainder of the subject process, the insulating substrates can be fabricated from any one of the materials known for such purpose in the prior art. Preferred are the reinforced polymeric resins in which the polymeric matrix comprises those resins noted above with reference to the binder for the inks according to the present invention. Reinforced resins of the phenolic type, of the unsaturated polyester type, of the epoxy type, or of the polyimide type, are therefore eminently suitable. These substrates are in general completely polymerized laminates in which one or more of the following principal reinforcing means are present: cellulosic papers, cotton fabrics, asbestos fabrics and papers, glass fabrics and glass mats. Other types of reinforcing fillers can of course also be used. Laminates of this type are well known in the art and thus will not be more fully characterized.

It will be appreciated that the technique immediately above-described enables obtainment of conducting paths which are of course perfectly suited for soldering.

It is self-evident that many modifications can be made to the embodiments which have just been described, in particular, by the substitution of equivalent means, for example, as regards the non-noble metal oxide which can be used, without thereby departing from the scope of the present invention. Thus, the cuprous oxide can be replaced by other non-noble metal oxides in which the state of oxidation is selected such as to permit easy reduction of the oxide by the borohydride; exemplary of suitable such oxides are nickel(II) oxide, cobalt(II) oxide, lead(II) oxide, cadmium(II) oxide, chromium(III) oxide, antimony(III) oxide and tin(IV) oxide.

In order to further illustrate the present invention and the advantages thereof, the following specific examples are given, it being understood that same are intended only as illustrative and in nowise limitative.

EXAMPLE 1

In this example is described a "potentially conducting ink" according to the present invention.

The following ingredients were dry mixed:
(i) 40.5 g of cuprous oxide having a particle size ranging from 0.5 to 2 $\mu$m; and
(ii) 4.5 g of a powder, having a particle size of less than 30 $\mu$m, of a prepolymer prepared from N,N'-4,4'-diphenylmethane-bis-maleimide and 4,4'-diaminodiphenylmethane (molar ratio bis-imide/diamine—2.5), having a softening point of 105° C.

30 g of $\alpha$-terpineol, containing 0.09 g of dicumyl peroxide dissolved therein, were then incorporated into the pulverulent mixture obtained as above. The entire mass was homogenized in a mortar. In the case where the various compounds mentioned above were used in larger amounts, the homogenization was carried out, for example, in crushing rolls or in other types of apparatus, such as those used for homogenizing paints. The rheology of the paste prepared in this manner was perfectly suited for use, in particular, in silk-screen printing.

EXAMPLE 2

In this example is described a "potentially resistant ink" according to the present invention.

This ink was prepared in the manner indicated in Example 1, but, on the one hand, the 40.5 g of cuprous oxide were now replaced by a mixture of 15 g of cuprous oxide with 15 g of powdered glass, having a particle size of less than 2 $\mu$m, and, on the other hand, the 4.5 g of polyimide prepolymer were now replaced by 15 g of the same prepolymer. The rheology of the paste prepared in this manner was again perfectly suited for use, in particular, in silk-screen printing.

EXAMPLE 3

In this example is described the production of a conductive circuit by the silk-screen technique of selective deposition.

The insulating substrate employed was a 12-ply laminate comprising 35% by weight of FR4-type epoxy resin and 65% by weight of glass fabric.

The potentially conducting ink prepared in Example 1 was deposited onto this substrate through a 325 mesh stainless steel silk screen which faithfully reproduced the pattern of the circuit sought to be formed. The resulting deposit and also the resulting definition of the pattern were of good quality.

The substrate was then dried for about ten minutes in a ventilated oven at 60° C., and then baked for 1 hour at 175° C. After the drying and baking steps, the thickness of the resultant deposit was 18 $\mu$m.

After cooling, this red-colored deposit was then immersed for one minute in an aqueous solution of sodium borohydride having a concentration of 1%. The reducing solution was at ambient temperature, namely, at about 20° C., and was stirred. After a treatment time of one minute, the initially red deposit became red-brown and, after rinsing and drying, it had a resistivity of 0.05 $\Omega/\square$.

EXAMPLE 4

In this example is described the production of a conductive circuit by the technique of uniform deposition, followed by selective reduction using a mask.

In this example, the insulating substrate employed was a 12-ply laminate comprising 35% by weight of polyimide resin prepared from N,N'-4,4'-diphenylmethane-bis-maleimide and 4,4'-diaminodiphenylmethane (molar ratio bis-imide/diamine=2.5), and 65% by weight of glass fabric.

The potentially conducting ink prepared in Example 1 was deposited uniformly over the entire surface of the substrate by knife coating. After drying and baking for 1 hour at 160° C., the resulting deposit had a thickness of 27 $\mu$m.

A negative photoresist, comprising the combination of a resin based on cyclized polyisoprene and of paraazidobenzacyclohexanone as a sensitizer, was then deposited uniformly over the entire surface of the ink by spraying. After drying, the layer of photoresist was imagewise exposed through a mask (made of photographic gelatin and reproducing the negative pattern of the circuit sought to be formed) under the light of a mercury vapor lamp for 20 seconds, and the image was then developed by dipping the substrate in pure xylene for 1 minute, such as to remove the portions of the photoresist which had not been exposed and which therefore became soluble in media which did not affect the exposed portions. The zones which are to be conductive thus appeared at the locations where dissolution was effected.

Following the procedure indicated in Example 3, the potentially conducting zones of the substrate which were developed in this manner were then subjected to the action of the reducing solution of sodium borohydride. Finally, the remaining photoresist was totally removed and the zones then appearing were insulating; this operation consisted of dissolving the photoresist by attack (stripping) with a suitable product marketed by Rhone-Poulenc under the trademark RP 1 332, the process being carried out at 90° C.–100° C.

A perfectly planar, thick-layer conducting circuit was ultimately obtained, which was capable of receiving further deposits. Its resistivity was 0.065 $\Omega/\square$.

EXAMPLE 5

In this example it is illustrated that the conducting circuits obtained according to the invention are perfectly suitable for soldering.

After reduction, rinsing and drying, the conducting circuit produced in Examples 3 or 4 was immediately passed between a flexible pressure roller, on the one hand, and a roller drawing a film of tin-based eutectic, on the other hand. It was found that the conducting zones were then covered with a continuous layer of a copper/tin alloy, which evidenced the formation of a complete coating of solder.

EXAMPLE 6

In this example is described the use of a potentially resistant ink.

The use of the potentially resistant ink according to Example 2, following the procedures described in Examples 3 (silk-screen technique) and 4 (masking technique), resulted in the production of resistant layers which displayed resistivities of 227 $\Omega/\square$ and 325 $\Omega/\square$, respectively.

EXAMPLE 7

In this example is described the production of a hybrid circuit having a plurality of thick layers by utilizing both the silk-screen technique and the masking technique.

The successive operations which were carried out on the substrate are shown in FIGS. 3 to 7 of the Figures of Drawing, depicting cross-sections of the substrates obtained after each operation.

The insulating substrate employed was the 12-ply laminate described in Example 3. The following operations were carried out:

(i) the potentially conductive ink according to Example 1 was deposited selectively onto the substrate by silk-screen printing, and the ink deposit was then dried, baked and reduced in the manner indicated above in Example 3. The conducting zones which thus appeared, and which constituted the first level of conductors, are represented by reference numeral 6 in FIG. 3;

(ii) secondly, the same ink as above was deposited uniformly over the entire surface of the substrate resulting from step (i). After drying and baking, a perfectly planar, insulating layer was obtained, represented by the reference numeral 7 in FIG. 4;

(iii) thirdly, using masking technique, the insulating layer 7 was reduced selectively at the location where it was desired to establish an interlayer conducting junction. The conducting zone which was developed in this manner is represented by reference numeral 8 in FIG. 5;

(iv) fourthly, the same potentially conducting ink was again deposited, uniformly, as in step (ii), onto the substrate resulting from step (iii). The insulating layer obtained after drying and baking is represented by reference numeral 9 in FIG. 6; and (v) fifthly, by again utilizing the masking technique, the insulating layer 9 was then reduced selectively according to the pattern selected for this second level of conductors. The conducting zones which then appeared are represented by reference numeral 10 in FIG. 7.

The operations (ii), (iii) and (iv) are repeated as many times as required to provide the desired number of additional levels of conductors. The operations (iv) and (v) are repeated as many times as required to produce the desired number of additional conducting circuits. By using potentially resistant inks, it is possible to intercalate resistant circuits of low thermal dissipation between the layers, it being necessary for the resistant circuits of high thermal dissipation to be brought to the surface.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. An electrically insulating, potentially conductive ink composition adapted for deposition fabrication of thick-layer hybrid electronic printed circuits, comprising from about 40% to about 70% of a particulate cuprous oxide extender, from about 4% to about 10% of a particulate binder, and a diluent therefor, which binder is curable in a temperature range of from approximately 100° to 300° C., wherein the ink composition is insulating when baked and conductive when suitably reduced.

2. An electrically insulating, potentially resistant ink composition adapted for deposition fabrication of thick-layer hybrid electronic printed circuits, comprising from about 30% to about 60% of a particulate extender admixture of from about 40% to about 60% particulate cuprous oxide and about 60% to about 40% particulate inert insulating extender, from about 10% to about 30% of a particulate binder, and a diluent therefor, which binder is curable in a temperature range of from approximately 100° to 300° C., wherein the ink composition is insulating when baked and is resistant if suitably reduced.

3. The ink composition of claim 2, wherein said insulating extender is comprised of powdered glass, an alkali metal silicate, an alumina, a carbonate or a sulfate.

4. The ink composition of claims 1 or 2, wherein said binder is comprised of a thermosetting prepolymer.

5. The ink composition of claim 4, wherein the particle size of said extender(s) is in the range of from about 0.1 to about 5.0 microns and the particle size of said binder is in the range of from about 5 to about 40 microns.

6. The ink composition of claim 4, wherein said prepolymer is comprised of a polyimide resin reaction product of an unsaturated dicarboxylic acid N,N'-bisimide with a primary polyamine.

7. The ink composition of claim 6, further comprising an adjuvant of one of a mono-imide, an ethylenically unsaturated polymerizable comonomer, an unsaturated polyester or an hydroxylated organosilicon compound.

8. The ink composition of claim 4, wherein said diluent is comprised of an ether of an alkanol or glycol, or a terpene alcohol.

* * * * *